(12) United States Patent
Kobayashi et al.

(10) Patent No.: US 7,982,295 B2
(45) Date of Patent: Jul. 19, 2011

(54) ELECTRONIC DEVICE, ELECTRONIC APPARATUS MOUNTED WITH ELECTRONIC DEVICE, ARTICLE EQUIPPED WITH ELECTRONIC DEVICE AND METHOD OF PRODUCING ELECTRONIC DEVICE

(75) Inventors: Hiroshi Kobayashi, Kawasaki (JP); Kenji Kobae, Kawasaki (JP); Shuichi Takeuchi, Kawasaki (JP); Hidehiko Kira, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/559,234

(22) Filed: Sep. 14, 2009

(65) Prior Publication Data

US 2010/0001388 A1     Jan. 7, 2010

Related U.S. Application Data

(63) Continuation of application No. PCT/JP2007/056077, filed on Mar. 23, 2007.

(51) Int. Cl.
     *H01L 23/02*      (2006.01)

(52) U.S. Cl. . 257/679; 257/678; 257/728; 257/E23.194; 257/E21.499; 257/E21.502; 340/572.1; 340/572.8; 438/127

(58) Field of Classification Search ......... 257/443, 257/787, 667; 343/872, 873
See application file for complete search history.

(56) References Cited

U.S. PATENT DOCUMENTS

| | | | | |
|---|---|---|---|---|
| 4,961,105 A * | 10/1990 | Yamamoto | .......... | 257/679 |
| 5,436,203 A * | 7/1995 | Lin | .................. | 29/841 |
| 5,989,941 A * | 11/1999 | Wensel | .......... | 438/127 |
| 6,406,990 B1 | 6/2002 | Kawai | | |
| 6,664,645 B2 | 12/2003 | Kawai | | |
| 6,780,671 B2 * | 8/2004 | Noguchi | .......... | 438/106 |
| 2002/0115278 A1 | 8/2002 | Kawai | | |
| 2006/0167531 A1 * | 7/2006 | Gertner et al. | .......... | 607/86 |
| 2007/0029569 A1 * | 2/2007 | Andrews | .......... | 257/99 |
| 2010/0001081 A1 * | 1/2010 | Kobayashi et al. | .......... | 235/492 |
| 2010/0001387 A1 * | 1/2010 | Kobayashi et al. | .......... | 257/679 |

FOREIGN PATENT DOCUMENTS

| | | |
|---|---|---|
| JP | 55-004917 A | 1/1980 |
| JP | 59-021049 A | 2/1984 |
| JP | 59-152741 U | 10/1984 |
| JP | 60-018934 A | 1/1985 |
| JP | 61-086886 A | 5/1986 |
| JP | 2001-014442 A | 1/2001 |
| JP | 2001-156110 A | 6/2001 |
| JP | 2001-217352 A | 8/2001 |
| JP | 2003-108964 A | 4/2003 |

OTHER PUBLICATIONS

International Search Report of PCT/JP2007/056077, Mailing Date of Jun. 26, 2007.
Notification of Transmittal of Translation of the International Preliminary Report on Patentability (form PCT/IB/338) of International Application No. PCT/JP2007/056077 mailed Oct. 8, 2009 with Forms PCT/IB/373 and PCT/ISA/237.

* cited by examiner

*Primary Examiner* — Victor Mandala
*Assistant Examiner* — William Harriston
(74) *Attorney, Agent, or Firm* — Fujitsu Patent Center

(57) ABSTRACT

An electronic device includes: a base; a conductor pattern formed on the base; a circuit chip electrically connected to the conductor pattern; and a reinforcing member which is disposed on the base to surround the circuit chip, whose outer shape is like a ring, and which includes concentric rings as an internal structure. The electronic device further includes a sealing member which fills an inside of the reinforcing member while covering the top of the circuit chip, thereby sealing the circuit chip on the base.

9 Claims, 6 Drawing Sheets

US 7,982,295 B2

ELECTRONIC DEVICE, ELECTRONIC APPARATUS MOUNTED WITH ELECTRONIC DEVICE, ARTICLE EQUIPPED WITH ELECTRONIC DEVICE AND METHOD OF PRODUCING ELECTRONIC DEVICE

CROSS-REFERENCE TO RELATED APPLICATION

This is a continuation application of PCT/JP2007/056077, filed on Mar. 23, 2007.

TECHNICAL FIELD

The present invention is related to an electronic device, an electronic apparatus mounted with the electronic device, an article equipped with the electronic device and a method of producing the electronic device.

BACKGROUND ART

Conventionally, there is widely known an electronic device having a base such as a printed wiring board and a circuit chip mounted on the base. This type of electronic device is used to control an electronic apparatus by being disposed within this electronic apparatus, or is used independently to exchange information with an external device. As an example of such an electronic device, there is known a RFID (Radio_Frequency_IDentification) tag that exchanges information with an external device represented by a reader/writer in a non-contact manner using radio waves. There are various types of RFID tags. As one type of RFID tag, there is proposed a tag having a structure in which a conductor pattern for radio communications and an IC chip are mounted on a base made of a plastic, a piece of paper, etc (see, for example, Japanese Laid-open Patent Publication No. 2001-156110). It has been conceived to use this type of RFID tag in such a manner that the RFID tag is adhered to an article to identify the article by exchanging information about the article with an external device.

FIG. 1 is a schematic cross-sectional diagram of an example of a conventional RFID tag.

An RFID tag 90 illustrated in FIG. 1 includes: a base 91 made of a flexible PET film or the like; an antenna 92 made of a conductor pattern and formed on the base 91; and a circuit chip 93 disposed on the antenna 92. In this circuit chip 93, a circuit for exchanging information with an external device through the antenna 92 is incorporated. The circuit chip 93 has connecting terminals 93a formed under the circuit chip 93, which are electrically connected to the antenna 92 by soldering or the like. Further, the circuit chip 93 is secured onto the base 91 with an adhesive 94. On the base 91 of the RFID tag 90, there are also provided: a potting compound 95 covering the circuit chip 93; and a ring-shaped reinforcing member 96 disposed to surround the circuit chip 93. There is also provided a covering member 97 that covers the entire tag main body including the base 91, the antenna 92, the circuit chip 93, the potting compound 95 and the reinforcing member 96. The potting compound 95 includes an inner portion 95a filling the inside of the reinforcing member 96 shaped like a ring. The inner portion 95a covers the top of the circuit chip 93 and seals the circuit chip 93 on the base 91.

There are cases where the RFID tag 90 receives a strong external force when the RFID tag 90 is used by being attached to an article made of a flexible material, such as clothing, and the RFID tag 90 is bent while being washed. As for the RFID tag 90, since the RFID tag 90 is provided with the potting compound 95 and the reinforcing member 96 disposed around the circuit chip 93 to protect the circuit chip 93, a crack in the circuit chip 93 per se is prevented even when the RFID tag 90 is bent.

DISCLOSURE OF INVENTION

In the RFID tag 90 however, although the circuit chip 93 of the RFID tag 90 is protected, a peripheral part of the reinforcing member 96 may be damaged. For example, when a bending stress is applied to the base 91, the applied stress may concentrate on an exposed part (a part surrounded by a circle indicated with a dashed line as illustrated in FIG. 1) of the antenna 92 outside the reinforcing member 96, thereby breaking the antenna 92.

A problem due to such a damage of a peripheral portion of the reinforcing member 96 is not limited to RFID tags and is common to electronic devices provided with a flexible base mounted with a circuit chip.

In view of the above circumstances, it is an object of the present invention to provide: an electronic device in which a bending stress applied to a circuit chip is reduced and breaking of a conductor pattern is avoided; an electronic apparatus mounted with the electronic device; an article equipped with the electronic device; and a method of producing the electronic device.

An electronic device achieving the above object includes:
 a base;
 a conductor pattern formed on the base;
 a circuit chip electrically connected to the conductor pattern;
 a reinforcing member which is disposed on the base to surround the circuit chip, whose outer shape is like a ring, and which includes a plurality of concentric rings as an internal structure; and
 a sealing member which fills an inside of the reinforcing member while covering a top of the circuit chip, thereby sealing the circuit chip on the base.

The electronic device of the present invention has such a structure that the sealing member covers the top of the circuit chip by filling the inside of the reinforcing member in the shape of a ring, thereby sealing the circuit chip on the base. Therefore, a stress is unlikely to be applied to the circuit chip even when the base is bent, which prevents cracking and peeling of the circuit chip. Moreover, in the electronic device according to the present invention, since the reinforcing member disposed to surround the circuit chip has concentric rings as an internal structure, a stress applied when the electronic device is bent is distributed over the rings, thereby preventing a break in the conductor pattern.

In the electronic device according to the present invention, preferably, the plurality of rings of the reinforcing member have interspace filled with an adhesive.

In the structure in which the space between adjacent rings is filled with the adhesive, a stress applied when the electronic device is bent is distributed over not only the rings of the reinforcing member but also the adhesive between the adjacent rings.

Further, in the electronic device according to the present invention, preferably, the plurality of rings include an outermost ring that is softer than at least any one of the remaining rings among the plurality of rings.

The reinforcing member, in particular, the outermost ring is prone to receive a stress when the entire electronic device is bent. By making the outermost ring soft, a stress applied to this outermost ring is reduced.

Furthermore, in the electronic device according to the present invention, the plurality of rings may include an outermost ring that has a radial width smaller than a radial width of at least any one of the remaining rings among the plurality of rings. Alternatively, the plurality of rings may include an outermost ring that has a smaller thickness in a thickness direction of the base than a thickness of at least any one of the remaining rings among the plurality of rings.

By making the radial width or the thickness of the outermost ring small, the outermost ring is made soft even when the rings are made of the same material.

Still furthermore, in the electronic device according to the present invention, preferably, the reinforcing member further includes a linking section that links at least two of the plurality of rings and is formed to be integral with the rings by being made of the same material as a material of the rings.

When the two rings and the linking section that links these two rings are combined by being made of the same material, merely placing the combined materials enable the two rings to be aligned and disposed with an appropriate space in between at a time in producing the electronic device. This makes the production of the electronic device easy.

Also, in the electronic device according to the present invention, the electronic device may be a RFID tag that causes the conductor pattern to function as a communications antenna and causes the circuit chip to carry out wireless communications via the conductor pattern.

An RFID tag used in the state of being attached to an article or a card is frequently bent. Therefore, the electronic device of the present invention is preferably applied to the RFID tag.

An electronic apparatus achieving the above object includes:
an electronic device; and
an apparatus main section driven by an operation of the electronic device,
wherein the electronic device includes
a base,
a conductor pattern formed on the base,
a circuit chip electrically connected to the conductor pattern,
a reinforcing member which is disposed on the base to surround the circuit chip, whose outer shape is like a ring, and which includes a plurality of concentric rings as an internal structure, and
a sealing member which fills an inside of the reinforcing member while covering a top of the circuit chip, thereby sealing the circuit chip on the base.

In the electronic apparatus of the present invention, a break in the conductor pattern is prevented even when, for example, the electronic apparatus itself is bent or the electronic device is bent for repair or maintenance. Therefore, the reliability of the electronic apparatus is improved.

An article achieving the above object includes:
an electronic device; and
an object equipped with the electronic device,
wherein the electronic device comprises:
a base,
a conductor pattern formed on the base,
a circuit chip electrically connected to the conductor pattern,
a reinforcing member which is disposed on the base to surround the circuit chip, whose outer shape is like a ring, and which includes a plurality of concentric rings as an internal structure, and
a sealing member which fills an inside of the reinforcing member while covering a top of the circuit chip, thereby sealing the circuit chip on the base.

For example, there are cases where an article equipped with the electronic device such as a RFID tag is bent together with the electronic device. Even in such a situation, cracking and peeling of the circuit chip as well as a break in the conductor pattern are prevented.

A method of producing an electronic device achieving the above object includes:
connecting a circuit chip to a conductor pattern formed on a base;
applying an adhesive to cover a top of the circuit chip with the adhesive;
disposing, on the base, a reinforcing member whose outer shape is like a ring and which includes a plurality of concentric rings as an internal structure, so that the circuit chip is surrounded by the plurality of concentric rings and at least an inside of the reinforcing member is filled with the adhesive; and
curing the adhesive, thereby sealing the circuit chip on the base with the adhesive and fixing the reinforcing member on the base.

In the method of producing the electronic device according to the present invention, the reinforcing member is disposed on the base so that the circuit chip is surrounded by the concentric rings, and the adhesive in the state of filling the inside of the reinforcing member is cured. As a result, an electronic device in which a stress is distributed to rings is produced.

As described above, according to the present invention, a bending stress is prevented from focusing on the circuit chip as well as on the conductor pattern.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BEST MODE FOR CARRYING OUT THE INVENTION

Embodiments of the present invention will be described with reference to the drawings.

Figure 2:
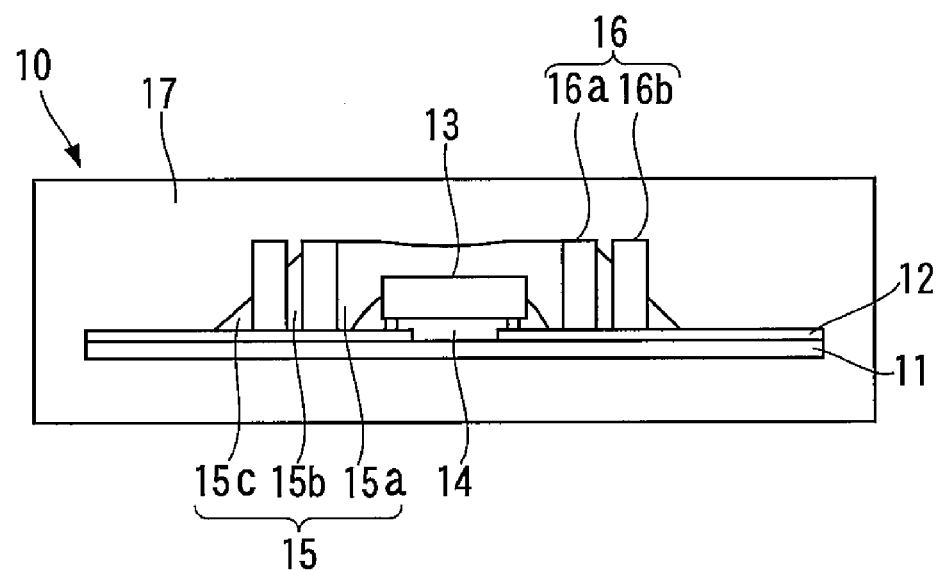
FIG. 2 is a cross-sectional view of a RFID tag that is a first embodiment of the present invention.
Figure 3:
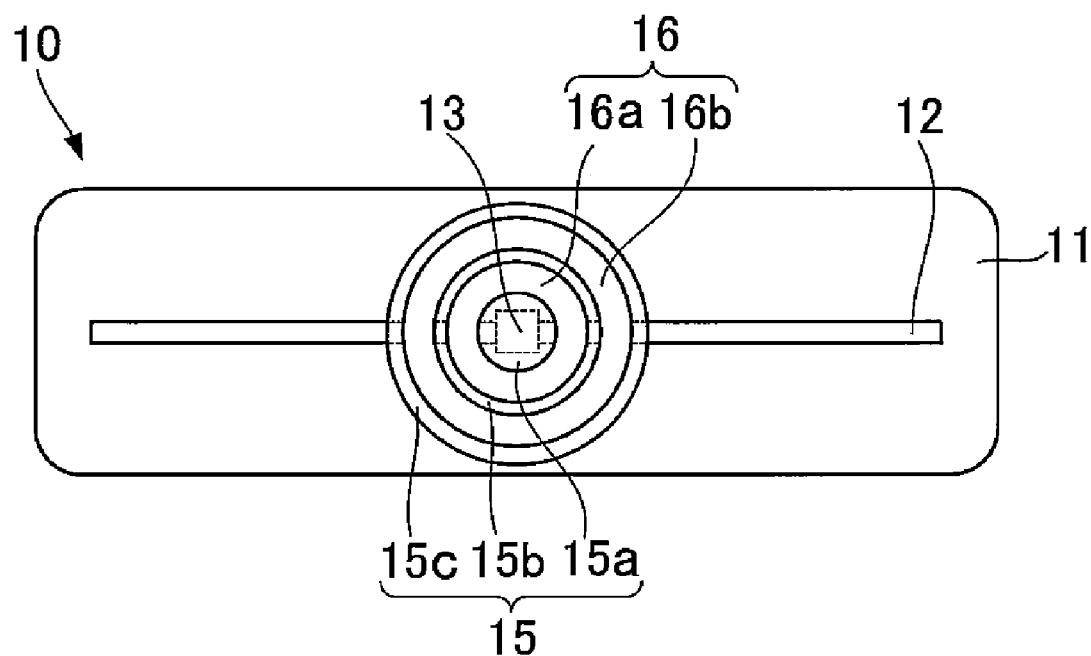
FIG. 3 is a plan view of the RFID tag that is the first embodiment of the present invention.

FIG. 2 and FIG. 3 are a cross-sectional view and a plan view, respectively, of a RFID tag that is a first embodiment of the electronic device of the present invention. Incidentally, a central part of the RFID tag illustrated in FIG. 2 is made larger than that illustrated in FIG. 3 so that the structure may be readily viewed.

Figure 1:
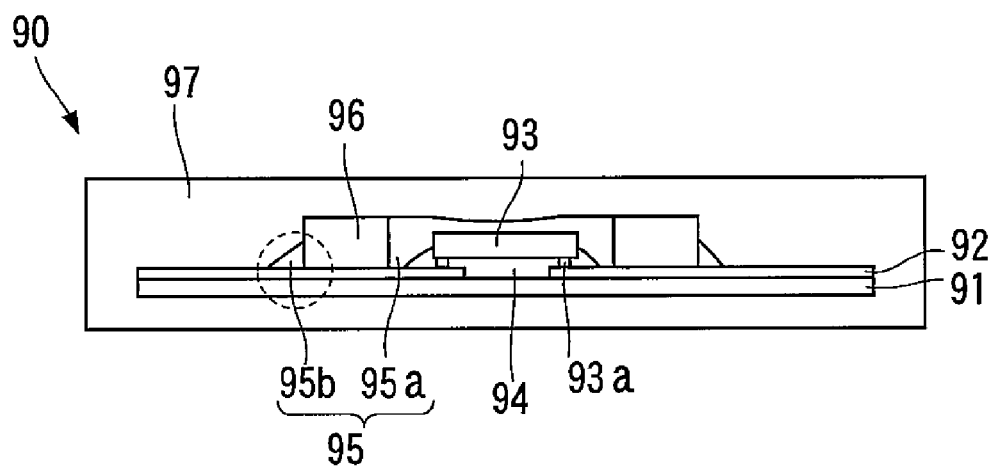
FIG. 1 is a schematic cross-sectional diagram of an example of a conventional RFID tag.

The RFID tag 10 illustrated in FIG. 2 and FIG. 3 has a sealing member and a reinforcing member whose structures are different from those of the RFID tag 90 illustrated in FIG. 1. Otherwise, the RFID tag 10 illustrated in FIG. 2 and FIG. 3 is the same as the RFID tag 90 illustrated in FIG. 1. To be more specific, an antenna 12 is formed on a flexible base 11 and a circuit chip 13 is mounted on the base 11, and the circuit chip 13 is fixed with an adhesive 14. Provided also on the base 11 are a potting compound 15 that covers the top of the circuit chip 13 and a ring-shaped reinforcing member 16 disposed to surround the circuit chip 13. Further, the entire device including the base 11, the antenna 12, the circuit chip 13, the potting compound 15 and the reinforcing member 16 is covered with a covering member 17. Incidentally, the covering member 17 is not illustrated in FIG. 3 so that the internal structure may be readily viewed.

The reinforcing member 16 has a ring-like outer shape and also has an internal structure including two rings; an inner ring 16a and an outer ring 16b. The inner ring 16a and the outer ring 16b are made of different types of resin materials. The material of the outer ring 16b is softer than the material of the inner ring 16a. Acryl (PMAA), for example, may be adopted as the material of the inner ring 16a, but other materials such as polyacetal (POM) and polyphenylene sulfide (PPS) may be employed. As the material of the outer ring 16b, polypropylene (PP), for example, may be adopted, but other materials such as ABS resin (ABS) and polyvinyl chloride (PVC) may be employed. The inner ring 16a and the outer ring 16b may be made of materials which include the same type of resin as the main component and whose softness are adjusted according to the types and added amounts of additives.

The potting compound 15 is divided into an inner portion 15a that fills the inside of the reinforcing member 16, a middle portion 15b that fills a space between the inner ring 16a and the outer ring 16b, and an outer portion 15c that surrounds the reinforcing member 16 from outside. The inner portion 15a of the potting compound 15 filling the inside of the reinforcing member 16 covers the top of the circuit chip 13 and seals the circuit chip 13 on the base 11.

The antenna 12 is an example of the conductor pattern according to the present invention, and the inner portion 15a of the potting compound 15 is an example of the reinforcing member according to the present invention. Further, the middle portion 15b is an example of the adhesive of the present invention, and the inner ring 16a and the outer ring 16b are examples of the rings of the present invention. Furthermore, the outer ring 16b is an example of the outermost ring of the present invention.

In the RFID tag 10, the reinforcing member 16 disposed to surround the circuit chip has the inner ring 16a and the outer ring 16b, and a stress produced as a result of bending the RFID tag 10 is distributed to the inner ring 16a and the outer ring 16b. Therefore, the stress is prevented from concentrating on both an exposed portion of the antenna 12 outside the inner ring 16a and an exposed portion of the antenna 12 outside the outer ring 16b, thereby averting a break in the antenna 12. In particular, since the outer ring 16b is softer than the inner ring 16a, the stress applied when the entire RFID tag 10 is bent is prevented from concentrating on the outer ring 16b that is the outermost ring. Further, the RFID tag 10 has such a structure that: the circuit chip 13 is surrounded by the reinforcing member 16; the top of the circuit chip 13 is covered by the inner portion 15a of the potting compound 15, which portion fills the inside of the reinforcing member 16; and the circuit chip 13 is sealed by both the inner portion 15a and the base 11. This structure prevents the stress from focusing on the circuit chip 13 and also avoids cracking, peeling etc. of the circuit chip 13. Moreover, since the space between the inner ring 16a and the outer ring 16b is filled with the middle portion 15b of the potting compound 15, a stress applied to this space between the inner ring 16a and the outer ring 16b is distributed over the middle portion 15b.

Next, a method of producing the RFID tag will be described.

Figure 4:
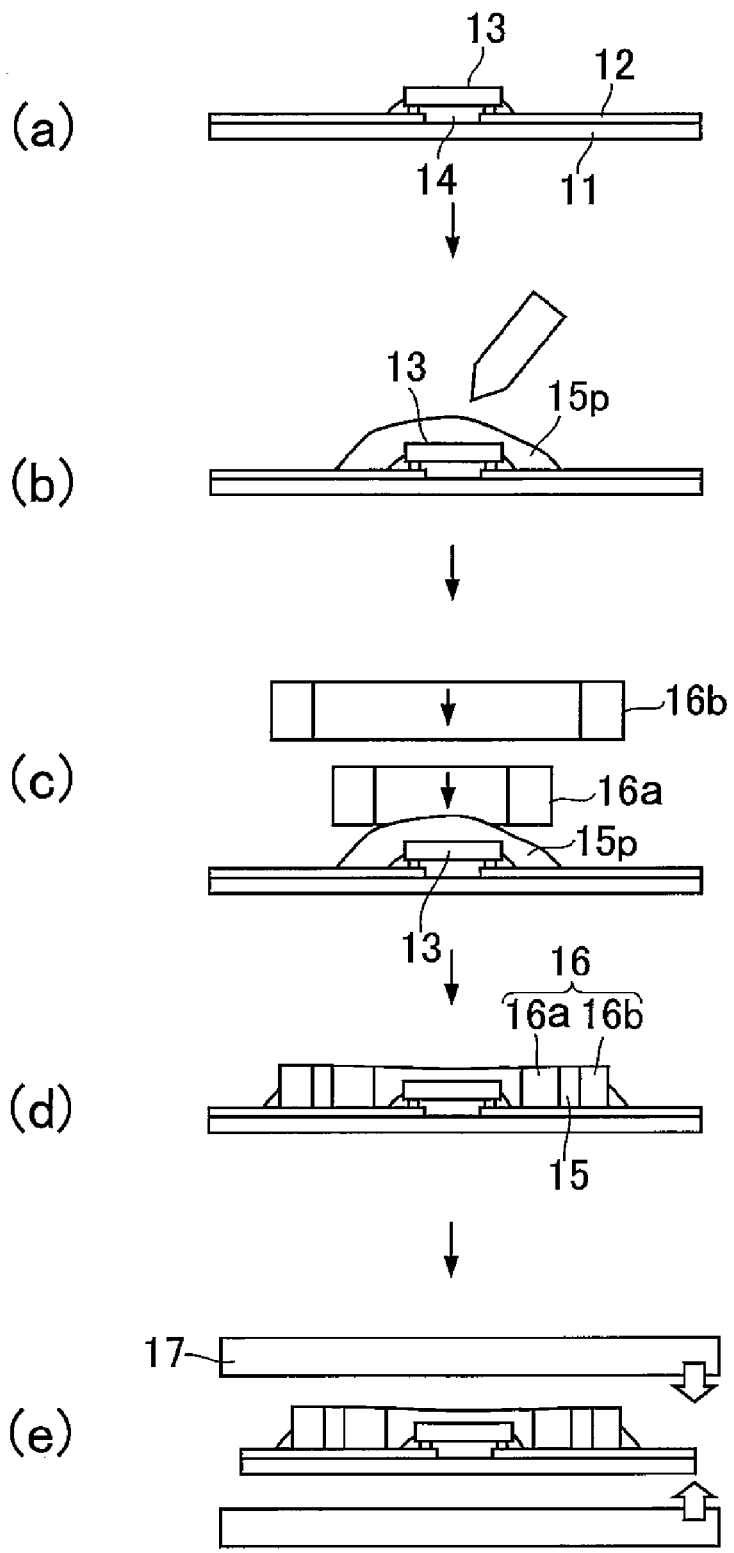
FIG. 4 is a diagram for describing a method of producing the RFID tag illustrated in FIG. 2 and FIG. 3.

FIG. 4 is a diagram for describing the method of producing the RFID tag illustrated in FIG. 2 and FIG. 3.

FIG. 4 illustrates a sequence of processes for producing the RFID tag in parts (a) through (e).

In order to obtain the RFID tag 10, first, the circuit chip 13 is connected to the antenna 12 formed on the base 11 in a connection process illustrated in part (a) of FIG. 4.

Subsequently, in an adhesive application process illustrated in part (b) of FIG. 4, a liquid potting compound 15p made of a thermosetting resin material is applied to cover the top of the circuit chip 13. The liquid potting compound 15p is also applied around the circuit chip 13.

Next, in a reinforcing-member arrangement process illustrated in parts (c) and (d) of FIG. 4, the inner ring 16a and the outer ring 16b are disposed on the base 11 after being aligned to surround the circuit chip 13. The inner ring 16a and the outer ring 16b are arranged to sink into the liquid potting compound 15p, so that the liquid potting compound 15p is divided into three parts to be respectively in three locations; the inner side of the inner ring 16a, the space between the inner ring 16a and the outer ring 16b, and the outer side of the outer ring 16b. Subsequently, as illustrated in part (d), the liquid potting compound 15p is cured by being heated to be the potting compound 15. As a result, the inner ring 16a and the outer ring 16b are combined by the potting compound 15, thereby completing the reinforcing member 16. Also, the inner portion 15a is formed in the inside of the inner ring 16a.

Next, in a covering process illustrated in part (e) of FIG. 4, the front side and the back side of the base 11 are covered with the covering member 17. The adhesion of the covering member 17 is achieved by heating and pressurizing the covering member 17. Upon completion of the covering process, the RFID tag 10 illustrated in FIG. 2 is obtained.

In the embodiment described above, the softness of the inner ring 16a and the outer ring 16b is adjusted by using different types of materials. Subsequently, there will be described a second embodiment and a third embodiment in which rings are made of the same material. In the following description of the second embodiment, the elements similar to those in the first embodiment described above will be indicated with the same reference characters as those used in the first embodiment, and the description of the second embodiment will focus on only the features different from the first embodiment.

Figure 5:
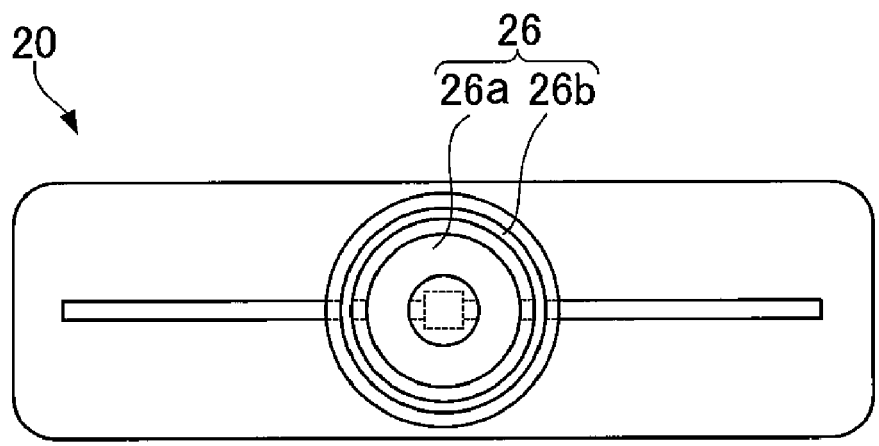
FIG. 5 is a plan view of a RFID tag that is a second embodiment of the electronic device according to the present invention.

FIG. 5 is a plan view of a RFID tag that is the second embodiment of the electronic device according to the present invention.

An RFID tag 20 illustrated in FIG. 5 has a reinforcing member 26 whose structure is different from the reinforcing member of the RFID tag 10 illustrated in FIG. 2 and FIG. 3. An inner ring 26a and an outer ring 26b of the reinforcing member 26 included in the RFID tag 20 are made of the same material. Further, the radial width of the outer ring 26b is smaller than the radial width of the inner ring 26a. Except this feature, the RFID tag 20 illustrated in FIG. 5 is the same as the RFID tag 10 illustrated in FIG. 2 and FIG. 3.

Since the radial width of the outer ring 26b is smaller than the radial width of the inner ring 26a, the outer ring 26b is softer than the inner ring 26a. Therefore, a stress applied when the RFID tag 20 is bent is prevented from concentrating on the outer ring 26b.

Figure 6:
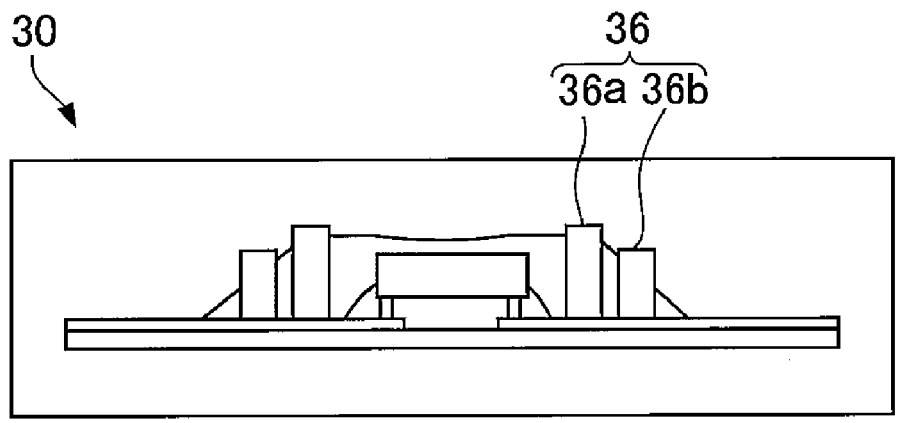
FIG. 6 is a cross-sectional view of a RFID tag that is a third embodiment of the electronic device according to the present invention.

FIG. 6 is a cross-sectional view of a RFID tag that is the third embodiment of the electronic device according to the present invention.

In a RFID tag 30 illustrated in FIG. 6, an inner ring 36a and an outer ring 36b of a reinforcing member 36 included in the RFID tag 30 are made of the same material. Further, the thickness (in the thickness direction of a base 11) of the outer ring 36b is smaller than the thickness of the inner ring 36a. Except this feature, the RFID tag 30 illustrated in FIG. 6 is the same as the RFID tag 10 illustrated in FIG. 2 and FIG. 3.

In the RFID tag 30 illustrated in FIG. 6, since the thickness of the outer ring 36b is smaller than the thickness of the inner ring 36a, the outer ring 36b is softer than the inner ring 36a. Therefore, a stress applied when the RFID tag 30 is bent is prevented from concentrating on the outer ring 36b.

Figure 7:
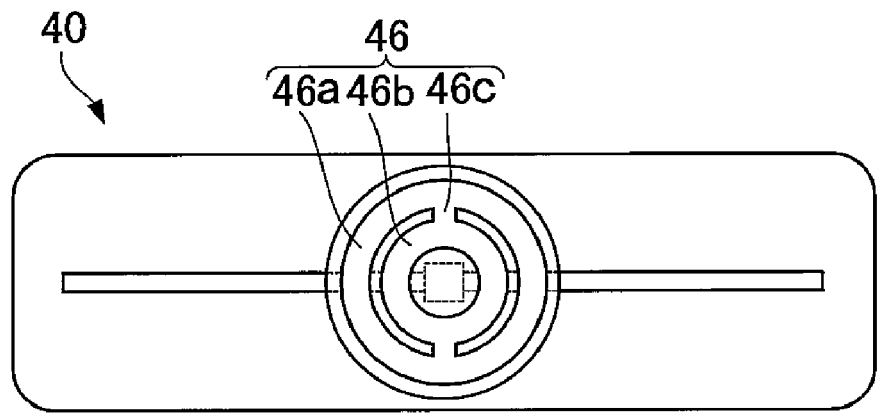
FIG. 7 is a cross-sectional view of a RFID tag that is a fourth embodiment of the electronic device according to the present invention.

FIG. 7 is a plan view of a RFID tag that is a fourth embodiment of the electronic device according to the present invention.

A reinforcing member 46 of an RFID tag 40 illustrated in FIG. 7 includes an inner ring 46a, an outer ring 46b, and a linking section 46c that links the inner ring 46a and outer ring 46b. The inner ring 46a, the outer ring 46b and the linking section 46c are made of the same material. At the time when the reinforcing member 46 is a single component before the RFID tag 40 is produced, the reinforcing member 46 has such a structure that the inner ring 46a and the outer ring 46b are concentrically arranged to surround a circuit chip 13 with a predetermined space in between. Except this feature, the RFID tag 40 illustrated in FIG. 7 is the same as the RFID tag 10 illustrated in FIG. 2 and FIG. 3. When the RFID tag 40 is produced, the reinforcing member 46 in which the inner ring 46a, the outer ring 46b and the linking section 46c are combined is disposed at a position surrounding the circuit chip 13 on the base 11, which enables the inner ring 46a and the outer ring 46b to be aligned at the same time.

Subsequently, as an example of applications for the RFID tag described above, there will be described clothing to which the RFID tag 10 is attached.

Figure 8:
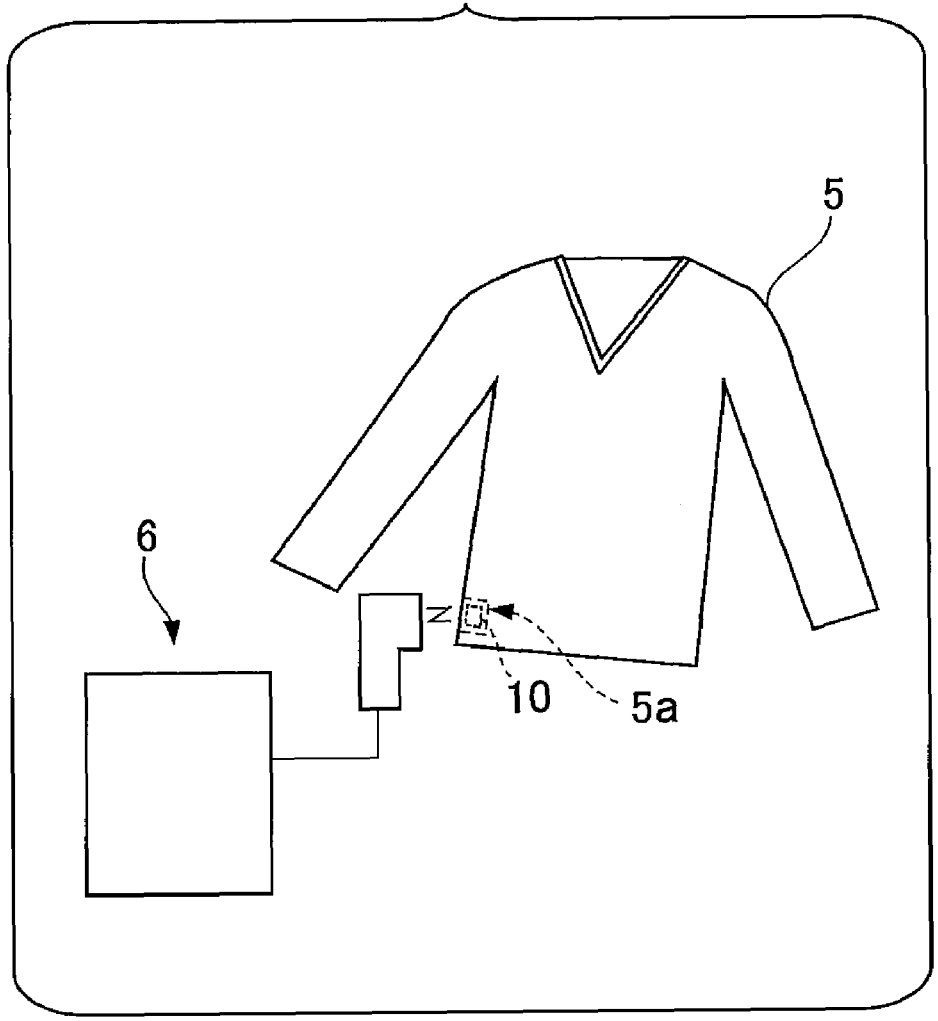
FIG. 8 is a diagram for describing a method of producing clothing to which the RFID tag is attached.

FIG. 8 is a diagram for describing a method of producing the clothing to which the RFID tag is attached.

For example, the RFID tag 10 illustrated in FIG. 2 and FIG. 3 is fixed to a tag 5a of clothing 5 as illustrated in FIG. 8 with adhesion or the like. In the RFID tag 10 attached to the clothing 5, information representing attributes of the clothing 5 is stored. For example, attribute information about the clothing 5 such as a JAN code is transmitted from an information writing device 6 to the RFID tag 10 through wireless communications, and then the attribute information is stored in the circuit chip 13 (see FIG. 2).

In the above-described embodiments, the RFID tags have been described as examples of the electronic device of the present invention. However, the electronic device of the present invention is not limited to the RFID tag and may be applied, for example, to a printed circuit board device where a circuit chip mounted on a flexible base is provided.

Figure 9:
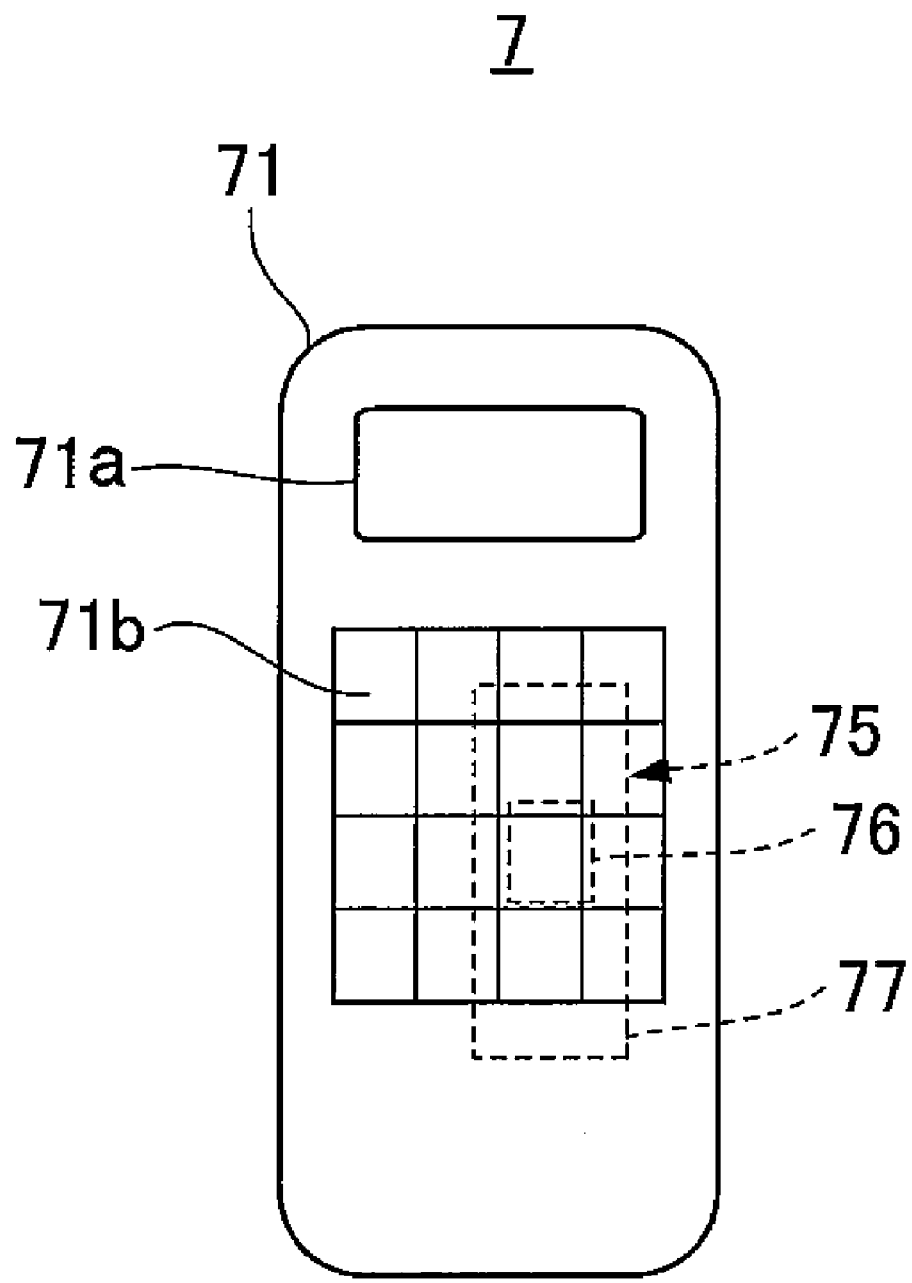
FIG. 9 is a schematic diagram of a printed circuit board device that is an embodiment of the present invention and an electronic desk calculator where the printed circuit board device is implemented.

FIG. 9 is a schematic diagram of a printed circuit board device that is an embodiment of the present invention and an electronic desk calculator where the printed circuit board device is implemented.

An electronic desk calculator 7 illustrated in FIG. 9 has a calculator main section 71 and a printed circuit board device 75 implemented on the calculator main section 71. The printed circuit board device 75 has a structure similar to that of the RFID tag 10 illustrated in FIG. 2 and FIG. 3. In other words, a circuit chip 76 is mounted on a flexible printed circuit 77 (FPC 77) serving as a base. Further, although illustration is omitted, the printed circuit board device 75 has such a structure that: a reinforcing member having rings with the same center are placed on the FPC 77 to surround the circuit chip; and a sealing member covers the top of the circuit chip and fills the inside of the reinforcing member, so that the circuit chip 76 is sealed by the FPC 77. However, the printed circuit board device 75 has features different from the RFID tag 10 illustrated in FIG. 2, which are: the circuit chip of the printed circuit board device 75 has the function of controlling the calculator main section 71; and a wiring pattern for transmitting signals between the circuit chip 76 and the calculator main section 71 is formed instead of an antenna. The calculator main section 71 is provided with a display section 71a for providing various types of displays and operation keys 71b, which are driven based on the operations of the circuit chip 76. In the electronic desk calculator 7 mounted with the printed circuit board device 75, a break in the wiring pattern on the printed circuit board device 75 is prevented even when the calculator main section 71 is bent.

Incidentally, there has been described the case in which the calculator main section 71 of the electronic desk calculator 7 is bent. However, the present invention is not limited to this case and may be applied, for example, to a case of an electronic apparatus having a main unit with a hard case where an electronic device in the state of being bent is disposed. Alternatively, the present invention may be applied to a case of an electronic apparatus with an electronic device that is prone to warp when removed for repair or maintenance. Also, the present invention is not limited to the electronic desk calculator and may be applied to various types of electronic apparatus such as a portable telephone on which an electronic device with a flexible base mounted with a circuit chip is implemented.

Further, in the embodiments described above, some examples of the RFID tags have been described. However, the electronic device of the present invention is not limited to the structure of each of the embodiments described above and may be a combination of any elements of these embodiments. For example, rings of a reinforcing member may be formed of different materials and these rings may have mutually different thicknesses or sizes. Furthermore, the reinforcing member may have, for example, an integral structure in which rings of mutually different thicknesses or sizes are linked by a linking section.

Furthermore, in the embodiments described above, the reinforcing member has been described as an element with two rings. However, the electronic device of the present invention is not limited to this structure and the reinforcing member may have three or more rings.

Still furthermore, although the embodiments each having a covering member have been described above, the electronic device of the present invention is not limited to these embodiments and may have no covering member.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device, comprising:
   a base;
   a conductor pattern formed on the base;
   a circuit chip electrically connected to the conductor pattern;
   a reinforcing member which is disposed on the base to surround the circuit chip, whose outer shape is like a ring, and which includes a plurality of concentric rings as an internal structure, the plurality of concentric rings being higher than the circuit chip in a direction in which the circuit chip projects from the base; and
   a sealing member which fills an inside of the reinforcing member while covering a top of the circuit chip, thereby sealing the circuit chip on the base,
   wherein the plurality of rings of the reinforcing member have interspace filled with an adhesive.

2. The electronic device according to claim 1, wherein in the reinforcing member, the plurality of rings include an outermost ring that is softer than at least any one of the remaining rings among the plurality of rings.

3. The electronic device according to claim 1, wherein in the reinforcing member, the plurality of rings include an outermost ring that has a radial width smaller than a radial width of at least any one of the remaining rings among the plurality of rings.

4. The electronic device according to claim 1, wherein in the reinforcing member, the plurality of rings include an outermost ring that has a smaller thickness in a thickness direction of the base than a thickness of at least any one of the remaining rings among the plurality of rings.

5. The electronic device according to claim 1, wherein the reinforcing member further includes a linking section that links at least two of the plurality of rings and is formed to be integral with the rings by being made of the same material as a material of the rings.

6. The electronic device according to claim 1, wherein the electronic device is a RFID tag that causes the conductor pattern to function as a communications antenna and causes the circuit chip to carry out wireless communications via the conductor pattern.

7. An electronic apparatus, comprising:
   an electronic device; and
   an apparatus main section driven by an operation of the electronic device,
   wherein the electronic device comprises:
   a base,
   a conductor pattern formed on the base,
   a circuit chip electrically connected to the conductor pattern,
   a reinforcing member which is disposed on the base to surround the circuit chip, whose outer shape is like a ring, and which includes a plurality of concentric rings as an internal structure, the plurality of concentric rings being higher than the circuit chip in a direction in which the circuit chip projects from the base, and
   a sealing member which fills an inside of the reinforcing member while covering a top of the circuit chip, thereby sealing the circuit chip on the base.

8. An article, comprising:
   an electronic device; and
   an object equipped with the electronic device,
   wherein the electronic device comprises:
   a base,
   a conductor pattern formed on the base,
   a circuit chip electrically connected to the conductor pattern,
   a reinforcing member which is disposed on the base to surround the circuit chip, whose outer shape is like a ring, and which includes a plurality of concentric rings as an internal structure, the plurality of concentric rings being higher than the circuit chip in a direction in which the circuit chip projects from the base, and
   a sealing member which fills an inside of the reinforcing member while covering a top of the circuit chip, thereby sealing the circuit chip on the base,
   wherein the plurality of rings of the reinforcing member have interspace filled with an adhesive.

9. A method of producing an electronic device, the method comprising:
   connecting a circuit chip to a conductor pattern formed on a base;
   applying an adhesive to cover a top of the circuit chip with the adhesive;
   disposing, on the base, a reinforcing member whose outer shape is like a ring and which includes a plurality of concentric rings as an internal structure, the plurality of concentric rings being higher than the circuit chip in a direction in which the circuit chip projects from the base, so that the circuit chip is surrounded by the plurality of concentric rings and at least an inside of the reinforcing member is filled with the adhesive; and
   curing the adhesive, thereby sealing the circuit chip on the base with the adhesive and fixing the reinforcing member on the base.

* * * * *